United States Patent
Won et al.

(10) Patent No.: US 9,147,775 B2
(45) Date of Patent: Sep. 29, 2015

(54) RIBBON FOR PHOTOVOLTAIC MODULE

(75) Inventors: Chang Sub Won, Seoul (KR); Bo Ram Kang, Anyang (KR); Kwang Wook Kim, Yongin (KR); Go Young Moon, Yongin (KR)

(73) Assignee: LSIS Co., Ltd., Anyang-Si, Gyeonggi-Do (KR)

( * ) Notice: Subject to any disclaimer, the term of this patent is extended or adjusted under 35 U.S.C. 154(b) by 303 days.

(21) Appl. No.: 13/110,849

(22) Filed: May 18, 2011

(65) Prior Publication Data

US 2011/0290530 A1    Dec. 1, 2011

(30) Foreign Application Priority Data

May 26, 2010 (KR) .................. 10-2010-0049264

(51) Int. Cl.
*H01L 31/042* (2014.01)
*H01L 31/00* (2006.01)
*H01L 31/02* (2006.01)
*H01L 31/05* (2014.01)

(52) U.S. Cl.
CPC ........ *H01L 31/0201* (2013.01); *H01L 31/0508* (2013.01); *Y02E 10/50* (2013.01)

(58) Field of Classification Search
CPC .. H01L 31/0201; H01L 31/0508; Y02E 10/50
USPC ................ 174/126.1; 136/244, 256
See application file for complete search history.

(56) References Cited

U.S. PATENT DOCUMENTS

| | | | | |
|---|---|---|---|---|
| 5,567,248 A | * | 10/1996 | Chung ................ | 136/244 |
| 2007/0095384 A1 | * | 5/2007 | Farquhar et al. ........ | 136/244 |
| 2007/0295381 A1 | | 12/2007 | Fujii et al. | |
| 2008/0083453 A1 | * | 4/2008 | Rose et al. ............ | 136/256 |

FOREIGN PATENT DOCUMENTS

| | | |
|---|---|---|
| JP | 63-164337 | 7/1988 |
| JP | 63164337 | 7/1988 |
| JP | 08-207281 | 8/1996 |
| JP | 8-207281 | 8/1996 |

(Continued)

OTHER PUBLICATIONS

Korean Intellectual Property Office Application Serial No. 10-2010-0049264, Office Action dated Jun. 22, 2011, 4 pages.

(Continued)

*Primary Examiner* — Tamir Ayad
(74) *Attorney, Agent, or Firm* — Lee, Hong, Degerman, Kang & Waimey

(57) ABSTRACT

A ribbon for a photovoltaic module includes a plurality of first interconnection ribbons connected to one solar battery cell, a plurality of second interconnection ribbons connected to another solar battery cell, and a bus ribbon through which the first and second interconnection ribbons are connected. In the ribbon, the bus ribbon includes a first ribbon connecting portion connected to the plurality of first interconnection ribbons, a second ribbon connecting portion connected to the plurality of second interconnection ribbons, and a string connecting portion connected between the first and second ribbon connecting portions. Accordingly, it is possible to decrease resistance at the connected portion between the bus ribbon and the interconnection ribbon and to minimize loss caused by serial resistance, thereby improving the power and light conversion efficiency of solar battery cells.

11 Claims, 3 Drawing Sheets

(56) References Cited

FOREIGN PATENT DOCUMENTS

| | | |
|---|---|---|
| JP | 08207281 | 8/1996 |
| JP | 2009-152222 | 7/2009 |
| JP | 2009152222 | 7/2009 |
| KR | 10-2010-0043473 | 4/2010 |
| WO | 2009/069415 | 6/2009 |
| WO | 2009069415 | 6/2009 |

OTHER PUBLICATIONS

Japan Patent Office Application Serial No. 2011-117735, Office Action dated Dec. 18, 2012, 3 pages.

Japan Patent Office Application Serial No. 2011-117735, Office Action dated Apr. 9, 2013, 3 pages.

The State Intellectual Property Office of the People's Republic of China Application Serial No. 201110148218.8 Office Action dated Jun. 24, 2013, 6 pages.

* cited by examiner

RIBBON FOR PHOTOVOLTAIC MODULE

CROSS-REFERENCE TO RELATED APPLICATION

This application claims the benefit of earlier filing date and right of priority to Korean Patent Application No. 10-2010-0049264, filed May 26, 2010, the disclosure of which is hereby incorporated herein by reference in its entirety.

BACKGROUND OF THE INVENTION

1. Field of the Invention

An aspect of the present invention relates to a ribbon for a photovoltaic module, through which solar battery cells are connected.

2. Description of the Related Art

Solar batteries function to convert solar energy to electrical energy. The solar batteries are manufactured using a semiconductor material such as silicon, gallium-arsenide, cadmium-telluride, cadmium-sulfide, indium-phosphorus or mixture thereof, and the silicon is mainly used as the semiconductor material.

A solar battery is manufactured by forming the p-n junction of a semiconductor material using a diffusion method, and uses the photovoltaic effect in which a small amount of current flows when the solar battery receives light. A solar battery is generally composed of a large-area p-n junction diode, and an electromagnetic force generated between both electrode terminals of the p-n junction diode is applied to an external circuit, thereby acting as a unit solar battery or solar battery cell.

Since the electromagnetic force generated from the solar battery cell is small, a plurality of solar battery cells is connected through a bus to form a photovoltaic module that generates a desired electromagnetic force.

FIG. 1 is a plan view of a conventional photovoltaic module.

In the conventional photovoltaic module, a plurality of solar battery cells 110 is arranged at an interval, and two interconnection ribbons 120 and 122 are connected to one solar battery cell 110. The interconnection ribbons of one solar battery cell 110 and the interconnection ribbons of another solar battery cell are connected to a bus ribbon 130. The bus ribbon 130 is connected to a load (not shown) that requires electric power.

Electric charges in the photovoltaic module flow in the two interconnection ribbons 120 and 122 and then move to the straight-line bus ribbon 130 connected perpendicularly to the interconnection ribbons 120 and 122.

In order to form the bus ribbon in a practical process, the bus ribbon 130 is cut to a predetermined length and then connected to string portions of the interconnection ribbons 120 and 122 through welding.

However, since such bus ribbon structure is connected to the interconnection ribbon as wide as the bus ribbon, and the connected portion is perpendicularly bent, resistance is changed depending on the position of the interconnection ribbon, and accordingly, serial resistance increases at the connected portion between the bus ribbon and the interconnection ribbon.

Because of small contact area between the interconnection ribbon and the bus ribbon, problems occur that contact resistance between the interconnection ribbon and the bus ribbon increases, and resistance increases too due to concentrated current at the perpendicularly bent portion.

SUMMARY OF THE INVENTION

Embodiments of the present invention provide a ribbon for a photovoltaic module, which can decrease resistance at a connected portion between a bus ribbon and an interconnection ribbon, and improve power and light conversion efficiency of solar battery cells.

According to an aspect of the present invention, there is provided a ribbon for a photovoltaic module, the ribbon including: a plurality of first interconnection ribbon connected to one solar battery cell; a plurality of second interconnection ribbon connected to another solar battery cell; and a bus ribbon through which the first and second interconnection ribbons are connected, wherein the bus ribbon comprises: a first ribbon connecting portion connected to the plurality of first interconnection ribbons; a second ribbon connecting portion connected to the plurality of second interconnection ribbons; and a string connecting portion connected between the first and second ribbon connecting portions.

In some exemplary embodiments, each of the first and second interconnection ribbons may be composed of two interconnection ribbons.

In some exemplary embodiments, a first contact portion connected to one first interconnection ribbon may be formed at one end of the first ribbon connecting portion, and a second contact portion connected to another first interconnection ribbon may be formed at the other end of the first ribbon connecting portion. The width of each of the first and second contact portions may be wider than that of the first ribbon connecting portion.

In some exemplary embodiments, a third contact portion connected to one second interconnection ribbon may be formed at one end of the second ribbon connecting portion, and a fourth contact portion connected to another second interconnection ribbon may be formed at the other end of the second ribbon connecting portion. The width of each of the third and fourth contact portions may be wider than that of the second ribbon connecting portion.

In some exemplary embodiments, bending portions may be respectively formed at both ends of the string connecting portion. One bending portion may be connected to the center of the first ribbon connecting portion, and the other bending portion may be connected to the center of the second ribbon connecting portion.

In some exemplary embodiments, the bending portion may be formed to have a curved surface.

In some exemplary embodiments, each of the first and second interconnection ribbons may be composed of three interconnection ribbons.

In some exemplary embodiments, a first contact portion connected to one first interconnection ribbon may be formed at one end of the first ribbon connecting portion, and a second contact portion connected to another first interconnection ribbon may be formed at the other end of the first ribbon connecting portion, and a third contact portion connected to the other first interconnection ribbon may be formed at the center of the first ribbon connecting portion. The width of each of the first, second and third contact portions may be extended from the end of the first ribbon connecting portion so as to be wider than that of the first ribbon connecting portion.

In some exemplary embodiments, a fourth contact portion connected to one second interconnection ribbon may be formed at one end of the second ribbon connecting portion, a fifth contact portion connected to another second interconnection ribbon may be formed at the other end of the second ribbon connecting portion, and a sixth contact portion connected to the other second interconnection ribbon may be formed at the center of the second ribbon connecting portion. The width of each of the fourth, fifth and sixth contact portions may be extended from the end of the second ribbon connecting portion so as to be wider than that of the second ribbon connecting portion.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

The present invention is described more fully hereinafter with reference to the accompanying drawings, in which embodiments of the present invention are shown. This present invention may, however, be embodied in many different forms and should not be construed as limited to the embodiments set forth herein. Rather, these embodiments are provided so that this disclosure is thorough, and will fully convey the scope of the present invention to those skilled in the art.

Figure 1:
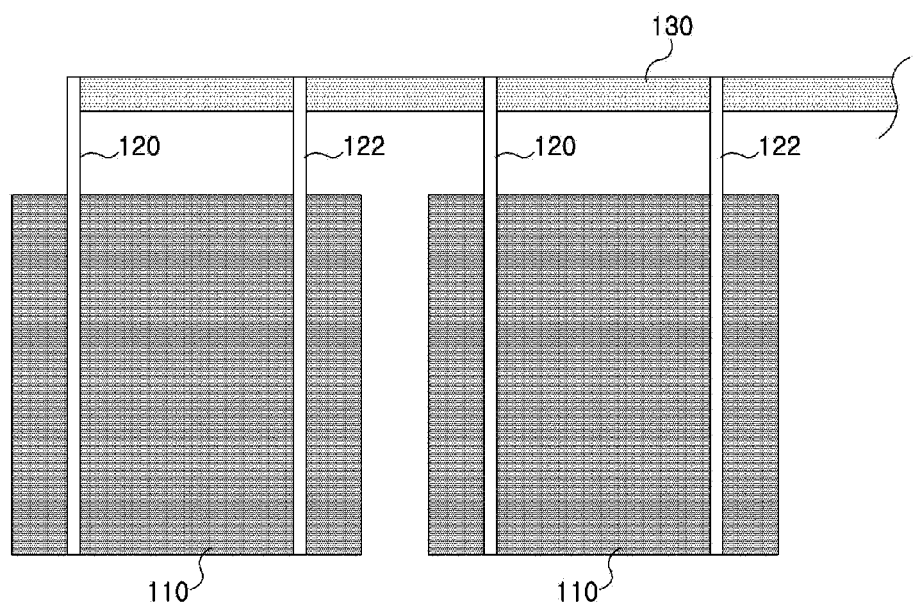
FIG. 1 is a plan view of a conventional photovoltaic module.
Figure 2:
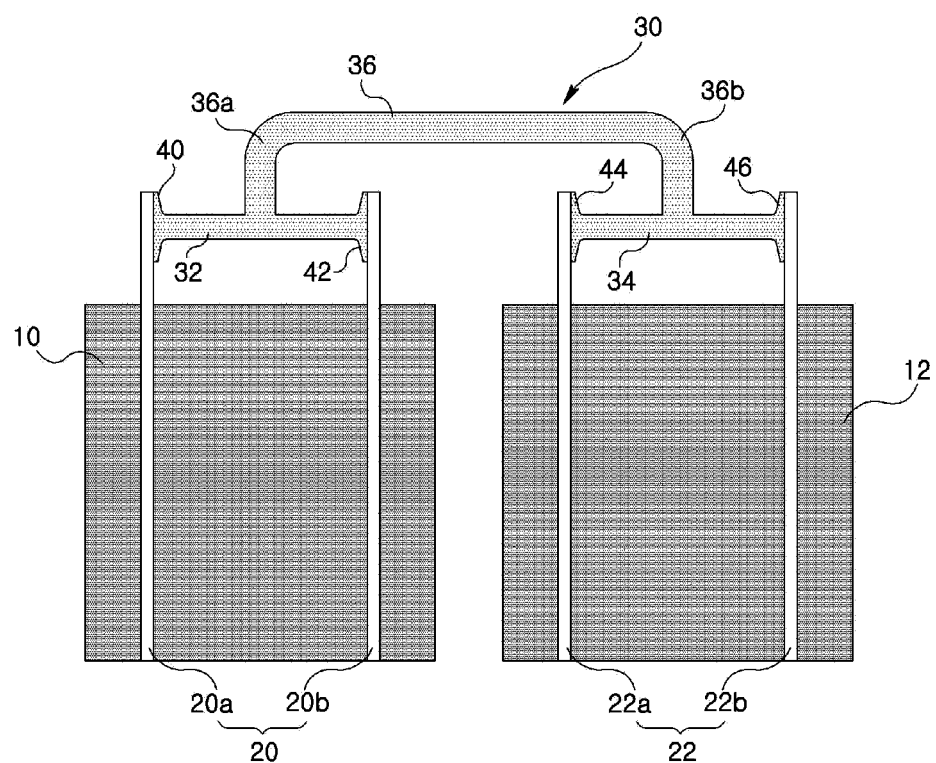
FIG. 2 is a plan view of a photovoltaic module according to an embodiment of the present invention.

FIG. 2 is a plan view of a photovoltaic module according to an embodiment of the present invention.

As shown in FIG. 2, the photovoltaic module according to this embodiment includes a plurality of solar battery cells 10 and 12 arranged at a predetermined interval, a plurality of interconnection ribbons 20 and 22 respectively connected to the solar battery cells 10 and 12, and a bus ribbon 30 through which the plurality of interconnection ribbons 20 and 22 are connected.

The interconnection ribbons 20 and 22 are composed of a first interconnection ribbon 20 connected to one solar battery cell 10 and a second interconnection ribbon 22 connected to a neighboring solar battery cell 12.

The first interconnection ribbon 20 is composed of two interconnection ribbons 20a and 20b, and the second interconnection ribbon 22 is also composed of two interconnection ribbons 22a and 22b.

These interconnection ribbons 20a, 20b, 22a and 22b are connected to the solar battery cells 10 and 12. The interconnection ribbons 20a and 20b are extended from one side of the solar battery cell 10 so as to be connected to the bus ribbon 30, and the interconnection ribbons 22a and 22b are extended from one side of the solar battery cell 12 so as to be connected to the bus ribbon 30.

The bus ribbon 30 includes a first ribbon connecting portion 32 to which the first interconnection ribbon 20 is connected, a second ribbon connecting portion 34 to which the second interconnection ribbon 22 is connected, and a string connecting portion 36 connected between the first and second ribbon connecting portions 32 and 34.

The bus ribbon 30 may be formed in a single body by molding or by cutting a metal plate. The interconnection ribbons and the bus ribbon are connected to each other by welding or the like.

The first and second ribbon connecting portions 32 and 34 are formed into the same structure, and are formed in the shape of a metal plate having a predetermined length and width.

A first contact portion 40 connected to the interconnection ribbon 20a is formed at one end of the first ribbon connecting portion 32, and a second contact portion 42 connected to the interconnection ribbon 20b is formed at the other end of the first ribbon connecting portion 32.

Like the same structure as that of the first ribbon connecting portion 32, a third contact portion 44 connected to the interconnection ribbon 22a is formed at one end of the second ribbon connecting portion 34, and a fourth contact portion 46 connected to the interconnection ribbon 22b is formed at the other end of the second ribbon connecting portion 34.

These contact portions 40, 42, 44 and 46 enable electric charges to be moved in a wide area by enlarging the contact area between the connect portions and the interconnection ribbons. Thus, resistance can be minimized, and accordingly, the loss of voltage drop can be reduced.

That is, the widths of the connecting portions are gradually extended from the ends of the ribbon connecting portions 32 and 34 so as to be wider than those of the ribbon connecting portions 32 and 34, respectively. The width of the contact portion is extended to have a predetermined inclination angle, thereby removing perpendicularly bent portions of the contact portion.

The string connecting portion 36 has bent portions 36a and 36b respectively formed at both sides thereof. One bent portion 36a is connected to the center of the first ribbon connecting portion 32, and the other bent portion 36b is connected to the center of the second ribbon connecting portion 34.

In this instance, the bonding portion of the string connecting portion 36 is formed to have a curved surface, thereby minimizing loss caused by the resistance. That is, in the movement of electric charges, the current flow is concentrated on an inside surface of the perpendicularly bent portion, and therefore, the resistance is increased. In this case, the perpendicularly bent portion is formed to have a curved surface, thereby minimizing the loss caused by the resistance.

Since string connecting portion 36 is connected to the centers of the ribbon connecting portions 32 and 34, the distribution of current is equalized. Accordingly, resistive loss can be minimized, and the efficiency of the solar battery cells can be improved.

Figure 3:
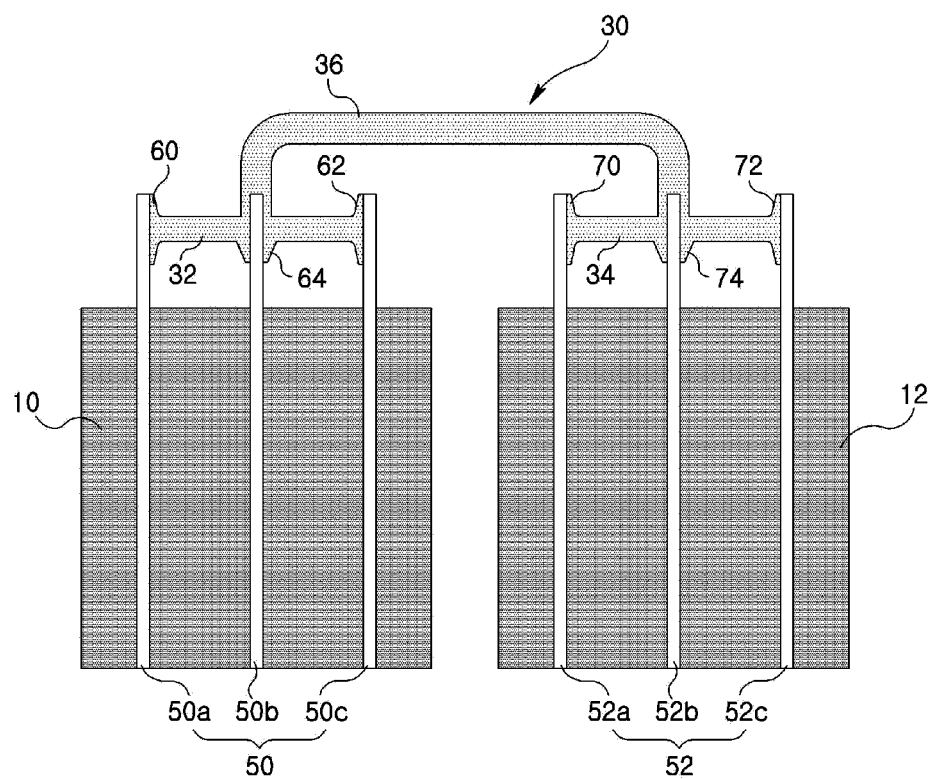
FIG. 3 is a plan view of a photovoltaic module according to another embodiment of the present invention.

FIG. 3 is a plan view of a photovoltaic module according to another embodiment of the present invention.

The photovoltaic module according to this embodiment has a structure in which three interconnection ribbons are connected to one solar battery cell.

Thus, a first interconnection ribbon 50 connected to a first ribbon connecting portion 32 is composed of three interconnection ribbons 50a, 50b and 50c, and a second interconnection ribbon 52 connected to a second ribbon connecting portion 34 is also composed of three interconnection ribbons 52a, 52b and 52c.

A first contact portion 60 connected to one interconnection ribbon 50a is formed at one end of the first ribbon connecting portion 32, and a second contact portion 62 connected to another interconnection ribbon 50b is formed at the other end of the first ribbon connecting portion 32. A third contact portion 64 connected to the other interconnection ribbon 50c is formed at the center of the first ribbon connecting portion 32.

A fourth contact portion 70 connected to one interconnection ribbon 52a is formed at one end of the second ribbon connecting portion 34, and a fifth contact portion 72 connected to another interconnection ribbon 52b is formed at the other end of the second ribbon connecting portion 34. A sixth contact portion 74 connected to the other interconnection ribbon 52c is formed at the center of the second ribbon connecting portion 34.

The widths of the plurality of connecting portions are gradually extended from the ends of the ribbon connecting portions so as to be wider than those of the ribbon connecting portions, respectively.

As described above, in a ribbon for a photovoltaic module according to embodiments of the present invention, a bus ribbon is composed of a first ribbon connecting portion connected to a plurality of first interconnection ribbons, a second ribbon connecting portion connected to a plurality of second interconnection ribbons, and a string connecting portion connected between the first and second ribbon connecting portions, so that it is possible to decrease the resistance at the connected portion between the bus ribbon and the interconnection ribbon and to minimize loss caused by serial resistance. Thus, the power of solar battery cells can be increased, and the light conversion efficiency of the photovoltaic module can be improved.

Although the present invention has been described in connection with the preferred embodiments, the embodiments of the present invention are only for illustrative purposes and should not be construed as limiting the scope of the present invention. It will be understood by those skilled in the art that various changes and modifications can be made thereto within the technical spirit and scope defined by the appended claims.

What is claimed is:

1. A ribbon for a photovoltaic module, the ribbon comprising:
    a plurality of first interconnection ribbons directly connected to a first solar battery cell;
    a plurality of second interconnection ribbons directly connected to a second solar battery cell; and
    a bus ribbon directly connected to the plurality of first interconnection ribbons and the plurality of second interconnection ribbons,
    wherein the bus ribbon comprises:
        a first ribbon connecting portion directly connected to the plurality of first interconnection ribbons, one end of the first ribbon connecting portion including a first contact portion directly connected to one of the plurality of first interconnection ribbons, and another end of the first ribbon connecting portion including a second contact portion directly connected to another of the plurality of first interconnection ribbons;
        a second ribbon connecting portion directly connected to the plurality of second interconnection ribbons, one end of the second ribbon connecting portion including a third contact portion directly connected to one of the plurality of second interconnection ribbons, and another end of the second ribbon connecting portion including a fourth contact portion directly connected to another of the plurality of second interconnection ribbons; and
        a string connecting portion comprising:
            a first end directly connected to the first ribbon connecting portion at a middle portion of the first ribbon connecting portion located between the first contact portion and the second contact portion of the first ribbon connecting portion; and
            a second end connected to the second ribbon connecting portion at a middle portion of the second ribbon connecting portion located between the third contact portion and the fourth contact portion of the second ribbon connecting portion;
    wherein:
        the first, second, third, and fourth contact portions are a same shape;
        widths of the first and second contact portions gradually increase from a width of the middle portion of the first ribbon connecting portion such that ends of the first ribbon connecting portion are wider than a width of the middle portion of the first ribbon connecting portion;
        widths of the third and fourth contact portions gradually increase from a width of the middle portion of the second ribbon connecting portion such that ends of the second ribbon connecting portion are wider than a width of the middle portion of the second ribbon connecting portion; and
        the first ribbon connecting portion and the second ribbon connecting portion are a same shape and a same size.

2. The ribbon of claim 1, wherein bent portions are formed at the first and second ends of the string connecting portion, one of the bent portions connected to the middle portion of the first ribbon connecting portion, and another of the bent portions connected to the middle portion of the second ribbon connecting portion.

3. The ribbon of claim 2, wherein the bent portions comprise a curved surface.

4. The ribbon of claim 1, wherein each of the plurality of first and second interconnection ribbons is composed of three interconnection ribbons.

5. The ribbon of claim 4, wherein:
    the first ribbon connecting portion further includes a fifth contact portion formed at the middle portion of the first ribbon connecting portion and connected to another of the plurality of first interconnection ribbons; and
    a width of the fifth contact portion is wider than the width of the middle portion of the first ribbon connecting portion.

6. The ribbon of claim 4, wherein:
    the second ribbon connecting portion further includes a sixth contact portion formed at the middle portion of the second ribbon connecting portion and connected to another of the plurality of second interconnection ribbons; and
    a width of the sixth contact portion is wider than the width of the middle portion of the second ribbon connecting portion.

7. The ribbon of claim 1, wherein:
    each of the plurality of first interconnection ribbons comprises a first portion located inside the first solar battery cell and a second portion located outside the first battery cell; and
    each of the plurality of second interconnection ribbons comprises a third portion located inside the second solar battery cell and a fourth portion located outside the second solar battery cell.

8. The ribbon of claim 7, wherein:
    the bus ribbon is connected to the plurality of first interconnection ribbons via the second portion of each of the plurality of first interconnection ribbons; and
    the bus ribbon is connected to the plurality of second interconnection ribbons via the fourth portion of each of the plurality of second interconnection ribbons.

9. The ribbon of claim 8, wherein:
the first ribbon connecting portion is connected to the plurality of first interconnection ribbons via the second portion of each of the plurality of first interconnection ribbons; and
the second ribbon connecting portion is connected to the plurality of second interconnection ribbons via the fourth portion of each of the plurality of second interconnection ribbons.

10. The ribbon of claim 9, wherein:
the first contact portion and the second contact portion are connected to the plurality of first interconnection ribbons via the second portion of each of the plurality of first interconnection ribbons; and
the third contact portion and the fourth contact portion are connected to the plurality of second interconnection ribbons via the fourth portion of each of the plurality of second interconnection ribbons.

11. The ribbon of claim 10, wherein:
the string connecting portion, the first ribbon connection portion, and the second ribbon connection portion are not aligned on a same axis; and
the string connecting portion is in parallel with an axis on which the first ribbon connecting portion and the second ribbon connecting portion are aligned.

* * * * *